(12) United States Patent
Sakai et al.

(10) Patent No.: US 6,331,348 B1
(45) Date of Patent: Dec. 18, 2001

(54) SUBSTRATE HAVING REPAIRED METALLIC PATTERN AND METHOD AND DEVICE FOR REPAIRING METALLIC PATTERN ON SUBSTRATE

(75) Inventors: Osamu Sakai, Miyagi-ken; Keiji Takagi, Fukushima-ken, both of (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/173,532

(22) Filed: Oct. 15, 1998

(30) Foreign Application Priority Data

Oct. 20, 1997 (JP) .................................................. 9-286910
Sep. 18, 1998 (JP) ................................................ 10-264180

(51) Int. Cl.⁷ ...................................................... B32O 3/00
(52) U.S. Cl. ......................... 428/209; 428/210; 428/901; 252/501.1; 252/514
(58) Field of Search ............................. 257/40; 428/210, 428/209, 901; 252/503.1, 514

(56) References Cited

U.S. PATENT DOCUMENTS

| | | | |
|---|---|---|---|
| 4,187,128 | 2/1980 | Bilings et al. | ........................ 148/121 |
| 4,859,256 | 8/1989 | Sawa et al. | ........................... 148/304 |
| 5,464,990 | * 11/1995 | Shiratsuki et al. | ...................... 257/40 |
| 5,738,733 | 4/1998 | Inoue | ................................... 148/304 |

FOREIGN PATENT DOCUMENTS

| | | |
|---|---|---|
| 219838A | 1/1990 | (JP) . |
| 267517A | 3/1990 | (JP) . |
| 2301723A | 12/1990 | (JP) . |
| 3-85523A | 4/1991 | (JP) . |

* cited by examiner

*Primary Examiner*—Cathy Lam
(74) *Attorney, Agent, or Firm*—Brinks Hofer Gilson & Lione

(57) ABSTRACT

Paste comprising metallic organic compound, in particular, gold-based metallic organic compound is used as a conductive material for repairing the broken defective part and is baked. This can produce a very thin metallic film having low electric resistance. Further, a semiconductor laser is used as a heating unit to heat only the broken defective part, and a heating profile having a baking process of provisional baking and main baking and a cooling process is provided to produce the high-quality thin metallic film having no crack and a dense texture.

13 Claims, 5 Drawing Sheets

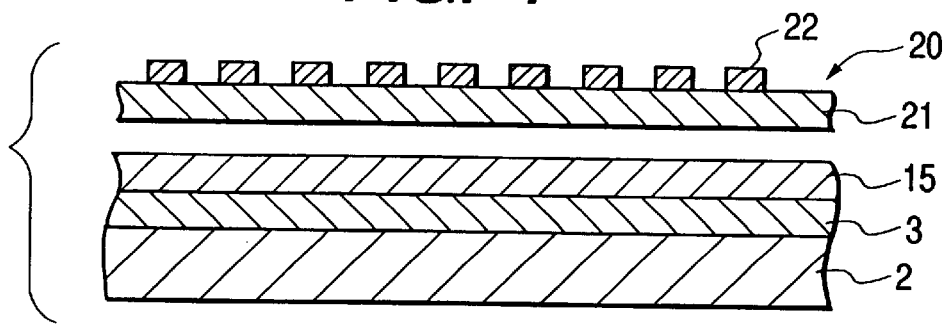
FIG. 7
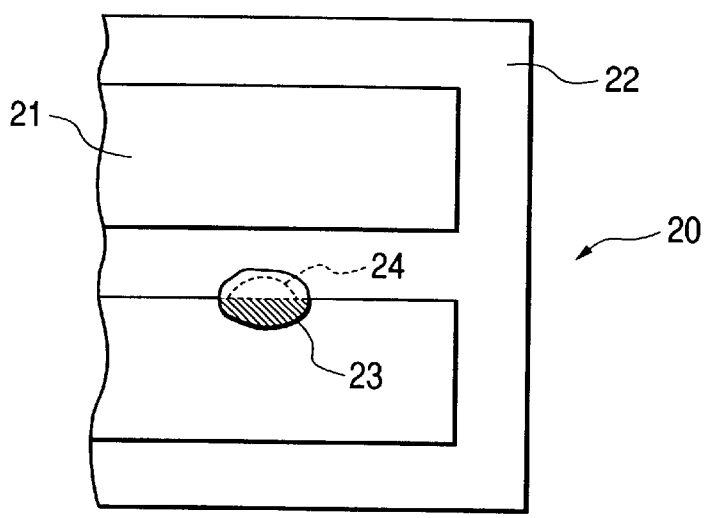
FIG. 8
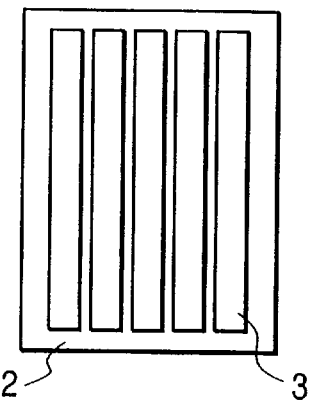 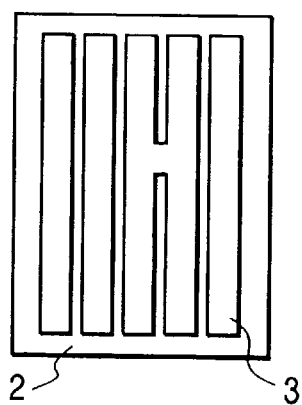 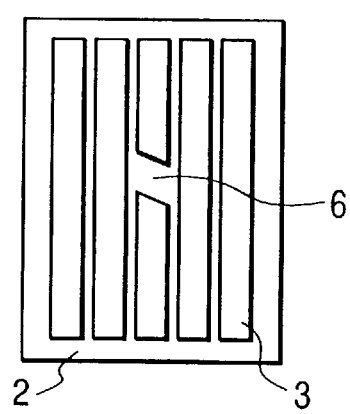
FIG. 9A  FIG. 9B  FIG. 9C

SUBSTRATE HAVING REPAIRED METALLIC PATTERN AND METHOD AND DEVICE FOR REPAIRING METALLIC PATTERN ON SUBSTRATE

BACKGROUND OF THE INVENTION

1. Field of the Invention

The present invention relates to a substrate, such as a glass substrate, used for a liquid crystal display device and having a repaired defect in a metallic pattern or a mask of a semiconductor formed on the substrate, and a method and a device for repairing the metallic pattern or the mask of the semiconductor on the substrate.

2. Description of Related Art

In recent years, a matrix type display device using a liquid crystal has been used widely as a display device for a computer instead of a display device using a cathode ray tube. Further, to increase the data displayed on a screen at one time, a liquid crystal display device or a plasma display device having a large screen or high definition has been developed. This has reduced yield and increased defective substrates, and hence, the defective substrates are repaired to reduce costs of liquid crystal display device.

An ordinary matrix type liquid crystal substrate is formed by etching transparent X and Y electrodes comprising ITO. on two glass substrates. Then, the substrates are arranged opposite to each other, such that the electrodes form a planar matrix pattern. The glass substrates are then filled with liquid crystal. When the X electrodes or the Y electrodes are formed on the substrates as described, the defects shown in FIG. 9 are sometimes produced by mixed foreign matter or by etching defects. FIG. 9A shows a good product and FIG. 9B shows a short-circuit defect in which neighboring lines are joined to each other and FIG. 9C shows a broken (open) defect in which a line is broken.

To repair the short-circuit defect shown in FIG. 9B, a short repair device, that is, a device for cutting a short-circuited part by laser irradiation has been-used.

To repair the open defect shown in FIG. 9C, the following methods have been disclosed;

- (W) an organoindium compound solution is applied to the open defective and then is heated to transform the applied film of the organoindium compound into a conductive layer (Japanese Unexamined Patent Application No. 3-85523),
- (X) a conductive liquid glass is applied to a defective part of a transparent electrode (Japanese Patent Application Laid-Open No. 2-67517),
- (Y) an adhesive comprising fine plastic particles is applied to an open defective of a bump (Japanese Patent Application Laid-open No. 2-301723),
- (Z) a conductive material is applied to an open defective and then laser irradiation is applied thereto (Japanese Patent Application Laid-Open No. 2-19838).

However, the above-mentioned techniques disclosed in (W) to (Z) have several drawbacks. For example, in the method disclosed in (W), the indium metal is oxidized when it is heated to form a conductive layer. Also, the oxidation is detrimental to the electric characteristics and the oxidation process produces a large amount of heat.

In the method disclosed in (X), the conductive glass used for repairing the open defect in the electrode produces large resistance, and the process generates a large amount of heat when repairing the defect. Similarly, the method disclosed in (Y) has structural problems in that resin containing conductive fine particles produces a large resistance and a large amount heat is needed in the process used to form the joined part. Further, a thick coated film needs to be used so as to realize a stable joining state.

In the method disclosed in (Z), a device referred to as a YAG laser for heating the conductive material is large in size and troublesome to handle. Also, because the output of the device cannot be freely controlled, the conductive material is rapidly baked and cooled, which can produce cracks in the repaired part. A carbon dioxide laser instead of the YAG laser has been used for baking, but any laser has advantage and disadvantage from the viewpoint of the usable life of the laser and handling of laser.

Further, since a line of a transparent electrode formed on the substrate of the liquid crystal display device is very small in width and in thickness, when the above-mentioned organ indium compound is applied, the conductive glass or the adhesive containing conductive fine particles are used, it is difficult to make the joined part very thin. Even if the joined part can be made thin, the quality of the joined part is not ensured because cracks are produced in the joined part.

Furthermore, when the transparent electrode is formed on the substrate of the liquid crystal display device, a resist material is applied to a thin film and is exposed to light by using a mask and is developed to form a resist pattern. Then the above-mentioned thin film is etched according to the resist pattern to form a transparent electrode having a predetermined pattern. In this regard, if the above-mentioned mask has a defect, the pattern formed on the transparent electrode also has a defect. Also, opaque film of the above-mentioned mask sometimes has a defect and when the defect is repaired, the above-mentioned problems are also produced. Still further, if the lithographic mask has a defect, the pattern is so fine that it is hard to repair the defect and hence the mask is scrapped. However, in recent years, it has been required that the defective pattern of the mask be repaired to reduce costs.

SUMMARY OF THE INVENTION

The present invention has been made to solve the above-mentioned problems. An object of the present invention is to provide a substrate having a repaired metallic pattern in which the defect is repaired while avoiding the generation of excessive heat and does not produce cracks in the repaired defective portion of the metal pattern. The invention also includes a method and a device for repairing a metallic pattern on a substrate for repairing an open defect of an electrode overlying a glass substrate of a liquid crystal display device and a defect of an opaque film of a mask with a thin film having good electric characteristics, that is, low electric resistance and good quality.

A substrate according to the present invention has a repaired metallic pattern whose defective portions are repaired by applying a conductive material thereon, wherein the defective portions are repaired by deposition of a thin film of metal deposited from a metallic organic compound.

If the above-mentioned metallic pattern is an electrode, the metallic organic compound is applied on the defective portion and then is heated to dissipate an organic component in the organic compound, whereby a thin film comprising only a metallic component is formed thereon. Therefore, a defective portion of the electrode formed on a liquid crystal substrate and having a very narrow width and a small thickness can be repaired by forming a thin film whose cross sectional area is equal to or less than that of the electrode.

In this respect, the glass substrate of the liquid crystal display device is typical of the substrate according to the present invention, but the present invention can also be used for the other substrates on which an IC is formed. Further, the electrode is the transparent electrode such as ITO in the case of the liquid crystal display device, but it may be a copper foil electrode or the gold foil electrode.

Further, the above-mentioned metallic pattern may be an opaque film. The opaque film can be applied to a mask that is subsequently used to form an electrode pattern on the glass substrate or for the fabrication of a semiconductor device. The opaque film on the glass substrate is a metallic pattern comprising chromium and is used as the mask. In this case, when a defect is produced in the opaque film, it is repaired by the above-mentioned means and then any portions protruding from the metallic pattern of the opaque film can be removed. The mask formed in this manner is placed on the electrode substrate on which a resist layer is formed and then is exposed to light and the resist is developed to form a pattern of the resist layer, and then an etching process is carried out using the resist pattern as an etching mask to form a high dense electrode pattern on the substrate.

In the case described above, it is preferable that the above-mentioned organic compound is gold-resinate-based paste for low temperature baking. If the defective portion of the substrate is repaired by a gold thin film using this paste, in accordance with the invention, the defective part can be made extremely conductive as compared with the defective portions repaired by a conventional repairing material, such as conductive resin. Therefore, the defective portion does not produce heat and hence can prevent the glass substrate from suffering damage by heat.

A method for repairing a metallic pattern on a substrate according to the present invention comprises steps of applying a metallic organic compound to a defect in a metallic pattern formed on the substrate, and heating the organic compound to deposit a metallic thin film in the defect.

It is preferable that a semiconductor laser is used as a heating source for baking the metallic organic compound, and that the output of the semiconductor laser is adjusted to provide a baking process comprising a multi-step heating process including a provisional baking and main baking process and a cooling process.

A metallic thin film of metal deposited from the metallic organic compound is formed as a dense metallic layer by the above-mentioned techniques according to the present invention. Although the metallic thin film is very thin, it can have stable electric characteristics. Further, since the paste is preferably black and a semiconductor laser is used to heat the paste, only the paste formed in the defective portion absorbs laser light and is heated while other portions of the substrate do not absorb the laser light and are not heated. Therefore, non-defective portions of the glass substrate do not suffer damage from the heat generated by the laser.

Further, according to the present invention, it is preferable to provide a removing process for removing portions protruding from the metallic pattern of a thin film made of deposited metal.

The metallic pattern can be used as a mask of an opaque film by the above-mentioned removing process, and the metallic thin film deposited after heating and removing any protruding portions that can be used to form a mask having a metallic pattern of high quality.

Further, a device according to the present invention for repairing a defective part in a metallic pattern formed on a substrate includes a receiving part for holding a metallic organic compound thereon, a transfer body moving between the receiving part and the defect in the electrode and transferring the metallic organic compound held on the receiving part to the defect, and a semiconductor laser for baking the metallic organic compound transferred to the defect in the electrode.

In the above-mentioned device, if the metallic pattern is an opaque film, it is preferable that the device is provided with a semiconductor laser for removing any portions protruding from the metallic pattern.

When the above-mentioned repairing device is applied to the opaque film, any portions protruding from the metallic pattern need to be removed after the metallic pattern is repaired, and if the part is not removed, the metallic pattern will be of poor quality. Therefore, since any protruding portions of the metallic pattern are cut by a laser, such as YAG laser, to prevent the deterioration of quality, even if the metallic pattern is an expensive mask made of chromium on the glass substrate, it does not need to be scrapped, which can reduce costs.

Further, it is preferable that the above-mentioned device is provided with a unit for adjusting the output of the semiconductor laser. By using the above-mentioned device, a very small amount of paste can be transferred smoothly to the defective part of the very fine electrode and a metallic thin film of high quality and having no cracks can be provided to repair on the defective portion.

BRIEF DESCRIPTION OF THE DRAWINGS

These and other objects and advantages of the present invention may be readily ascertained by referring to the following description and appended drawings, in which:

FIG. 7 shows a method for forming an electrode pattern on a substrate by using an opaque film;

FIG. 8 shows a method for repairing a defect in a metal pattern; and

FIGS. 9A to 9C are plan views of electrodes formed on a substrate, in which FIG. 9A shows normal electrodes, FIG. 9B shows an electrode having a short-circuited defect, and FIG. 9C shows an electrode having a broken defect.

DETAILED DESCRIPTION OF THE PREFERRED EMBODIMENTS

A substrate having an electrode repaired according to the present invention will be described with reference to the drawings.

Figure 1A:
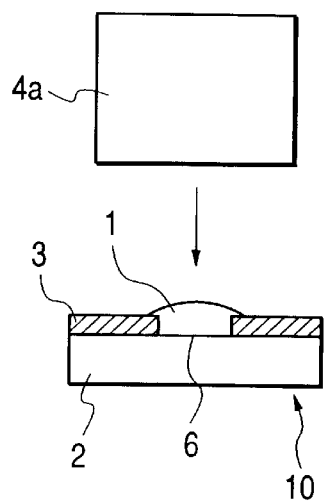
FIG. 1A, FIG. 1B, and FIG. 1C show steps of a method for repairing an electrode according to the present invention.
Figure 1B:
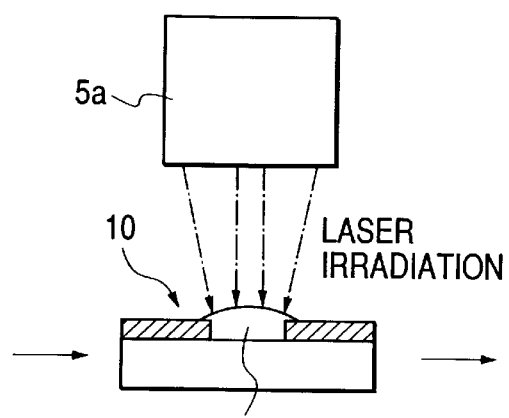
Figure 1C:
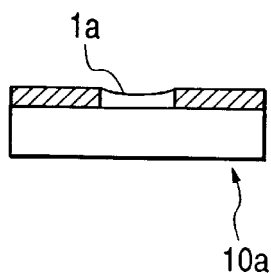

FIG. 1A, FIG. 1B, and FIG. 1C schematically show steps of a method for repairing a broken defect, FIG. 1A shows a state in which paste 1 comprising metallic organic compound is applied on an open defective 6, FIG. 1B shows a state of heating the paste 1, and FIG. 1C shows the repaired state of the open defective 6 after heating.

In FIG. 1A, a substrate 10 shows a state of the substrate before repairing, in which paste 1 comprising metallic organic compound and an electrode 3 are laminated on a glass substrate 2. Glass substrate 2 is an ordinary substrate, and electrode 3 is made of ordinary material of ITO, or the like, and is formed in a line by patterning and etching on glass substrate 2 in an equal width and in an equal pitch. Further, paste 1 comprising metallic organic compound is formed by a transfer unit 4 open defective 6 of electrode 3 on the glass substrate 2. Open defect 6 is made in electrode 3 by a foreign substance mixed in the film plane of ITO or the like when electrode 3 is formed using an etching process (see FIG. 9C).

Figure 2:
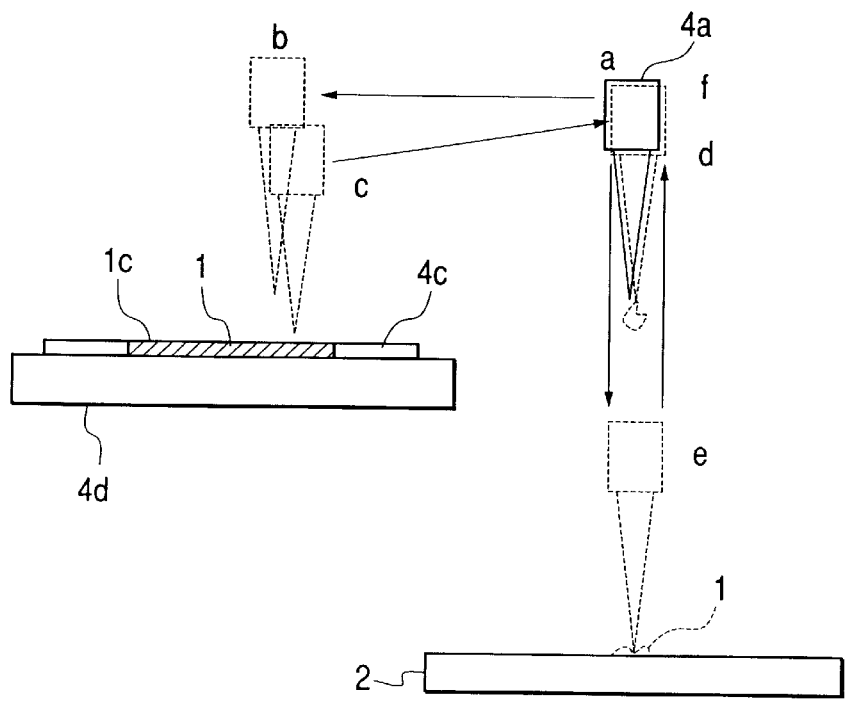
FIG. 2 shows an action of a transfer probe.

Transfer unit 4, as shown in FIG. 2, comprises a transfer probe 4a, a base 4d having a receiving part, and a plate frame 4c. Paste 1 is poured in the plate frame 4c and is leveled off by a squeegee to make a plate paste 1c. Further, transfer probe 4a is provided with a moving unit 13a (see FIG. 5) and can be freely moved between open defect 6 and plate paste 1c.

Figure 3A:
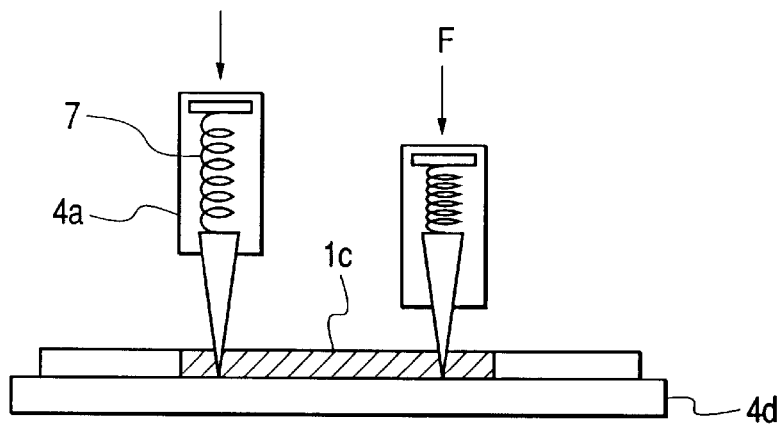
FIG. 3A is a front view of the transfer probe shown in FIG. 2.
Figure 3B:
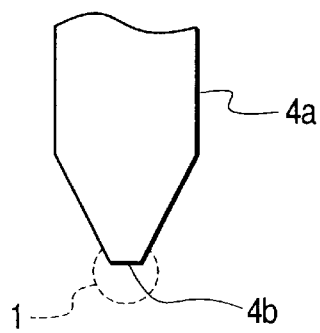
FIG. 3B is an enlarged view of a portion of the transfer probe shown in FIG. 3A.

FIG. 2 shows an action of transfer probe 4a and a predetermined amount of paste 1 is transferred to the tip end of the transfer probe 4a in the following actions: the transfer probe 4a is moved from an initial state (a) above the plate paste 1c (b) and is lowered there (c), then, transfer probe 4a is pressed on plate paste 1c until it reaches the bottom thereof and then transfer probe 4a is moved up, whereby a predetermined amount of paste 1 is transferred to the tip end of transfer probe 4a. In this regard, as shown in FIG. 3A, the transfer probe has a coil spring 7 as an elastic body in itself and when transfer probe 4a reaches the bottom of plate paste 1c, the coil spring 7 is pressed by a force F against the urging force of coil spring 7 from above transfer probe 4a. Next, the transfer probe 4a is moved above open defect 6 of glass substrate 2 (d) and is lowered there (e). Then, transfer probe 4a is moved up to separate paste 1 from transfer probe 4a, whereby paste 1 is transferred on open defect 6 and transfer probe 4a returns to the initial state (f).

Further, it is preferred that the material of transfer probe 4a be beryllium copper, and that the tip end of transfer probe 4a have a flat shape 4b to easily transfer paste 1 to the tip end.

By employing transfer probe 4a as described above, a predetermined amount of paste 1 can always be transferred without a positioning mechanism or controller of high accuracy. Further, the amount of paste 1 to be transferred is changed easily by changing the depth of plate paste 1c.

Preferably, paste 1 comprises a metallic organic compound and is not gold powder-based gold paste, but rather organic matter combined with gold atoms, and is preferably formed as a liquid paste. It is also preferable to use gold paste formed by gold-resinate-based MOD (metalloorganic deposition) as paste 1. In particular, gold paste is preferred for low temperature baking. Before repairing open defect 6 on substrate 10, open defect 6 is filled with transferred paste 1 as described above and baked prior to carrying out the laser irradiation step shown in FIG. 1B.

Referring to FIG. 1B, a semiconductor laser 5a is employed as a heating source for baking and irradiating paste 1 with near-infrared rays having a wavelength of approximately 810 nm. In this respect, although not shown, semiconductor laser 5a is constituted by a plurality of semiconductor elements, that is, beams of laser light radiated from the semiconductor elements are bundled by glass fibers and are converged by a lens unit and radiated on an object.

When semiconductor laser 5a is used, as shown in FIG. 1B, laser light radiated on paste 1 is absorbed to heat paste 1, but laser light radiated on the other portions of electrode 3 and glass substrate 2 is not absorbed but passes through electrode 3 and glass substrate 2. That is, semiconductor laser 5a uses an element radiating near-infrared rays and the near-infrared rays are absorbed by paste 1 because paste is black. Only the transferred paste 1 is heated and the other portions of glass substrate 2 is not heated and hence is not damaged. Further, the output intensity of semiconductor laser 5a can be easily controlled after paste 1 is baked to form a high quality, repaired metallic pattern.

Figure 4:
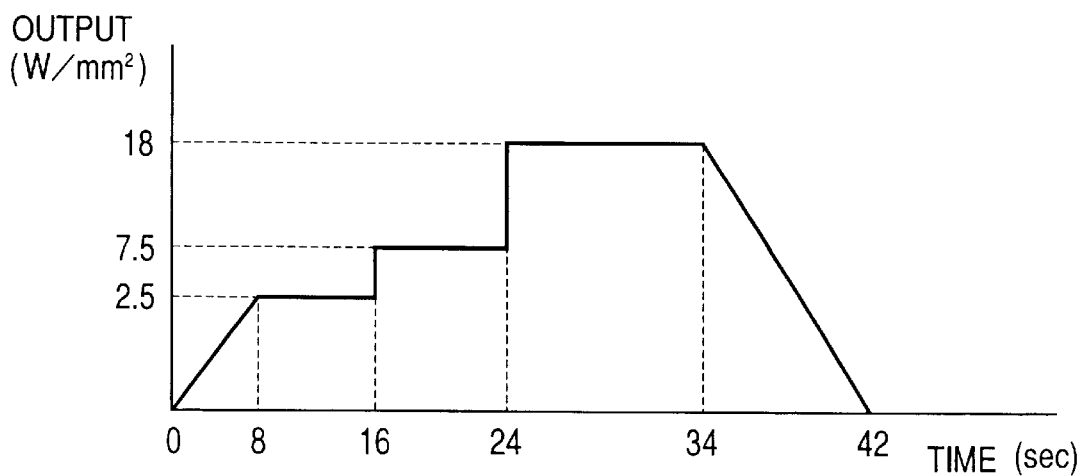
FIG. 4 is a profile showing a relationship between time and output in a baking process.

Shown in FIG. 4 is a profile of a heating process for producing a baked part of high quality as described above. In FIG. 4, the horizontal axis designates time and the vertical axis designates laser output per unit area.

First, the laser output is increased to a predetermined value, preferably in about 0 to about 8 sec and is held at low values for predetermined periods, preferably about 8 to about 16 sec, and about 16 to about 24 sec to provisionally bake paste 1, whereby solvent contained in liquid paste 1 is dissipated. Then, the laser output is held at a high value for a predetermined period, preferably about 24 to about 34 sec to bake paste 1 in a main baking process, whereby metallic components are deposited. After baking paste 1, the laser output is decreased gradually, preferably over a period of about 34 to about 42 sec to cool paste 1. When paste 1 undergoes the treatment described above, a metallic deposit formed in open defect 6 becomes a high-quality metallic film 1a having substantially no cracks and a dense texture. In this regard, the profile shown in FIG. 4 is only an example and can be changed according to the amount of transferred metallic organic compound.

Open defect 6 is repaired as described above to produce a metallic thin film made of a metallic deposit as shown in FIG. 1C, which produces a repaired substrate 10a.

As described above, the method for repairing the defective electrode on the substrate according to the present invention comprises steps of, transferring paste 1 comprising metallic organic compound on open defect 6 in electrode 3 on glass substrate 2 by the transfer unit 4, and baking paste 1 by the heating unit 5 comprising semiconductor laser 5a to deposit only the metallic component contained in paste 1.

Figure 5:
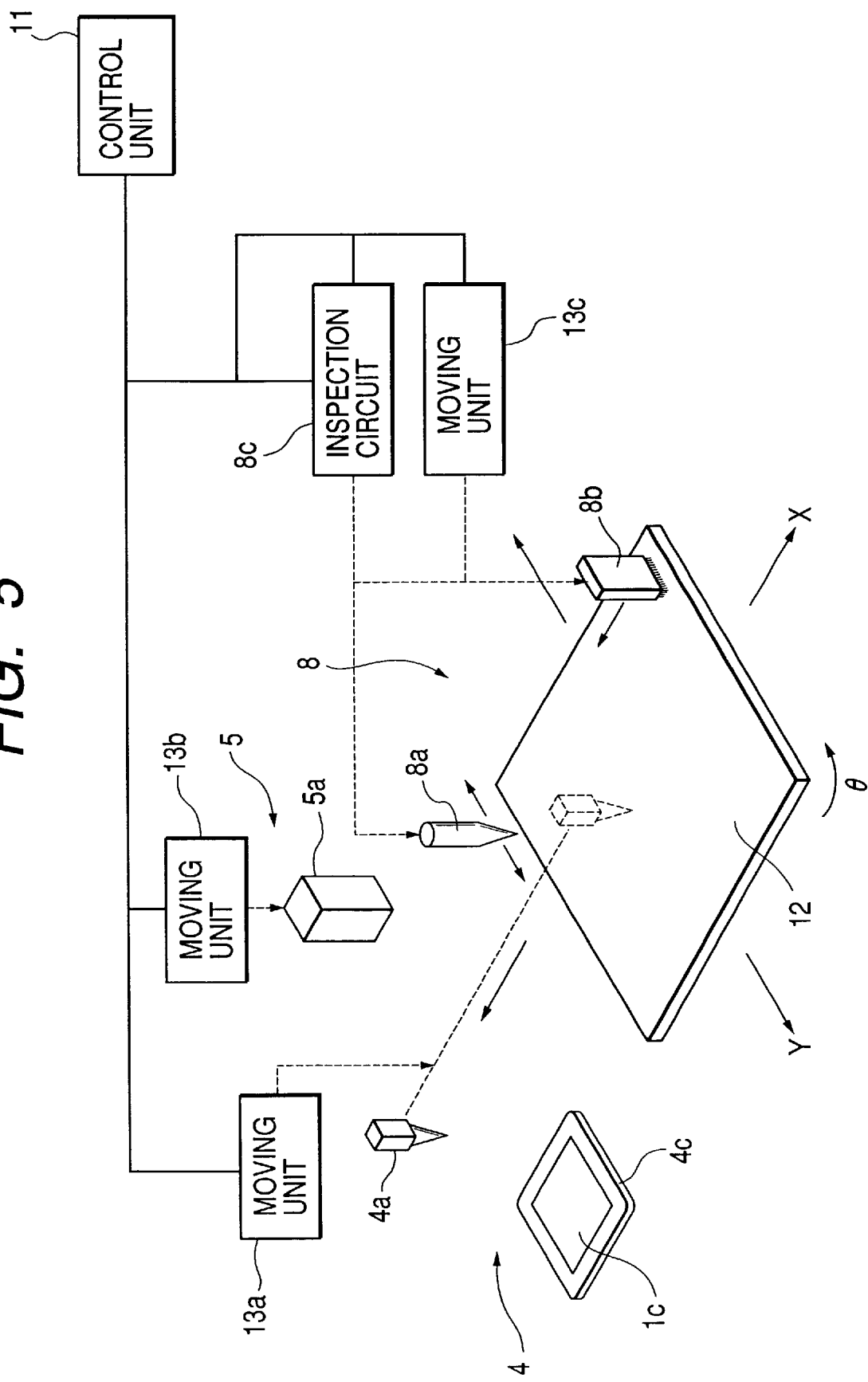
FIG. 5 is a schematic view showing an electrode repairing device according to the present invention.

FIG. 5 is a general view of a device 8 for inspecting and repairing electrode 3 on substrate 10.

The device comprises a table 12, an inspection unit 8, a transfer unit 4, and a heating unit 5. Table 12 is a table on which glass substrate 2 having electrode 3 is placed and can be moved freely in the X direction, in the Y direction, and in the rotational direction (0) to compensate for the position of glass substrate placed on table 12. Inspection unit 8 has an inspection probe 8a and an inspection brush 8b and these parts are connected to an inspection circuit 8c and a moving unit 13c and are controlled by a control unit 11.

Figure 6A:
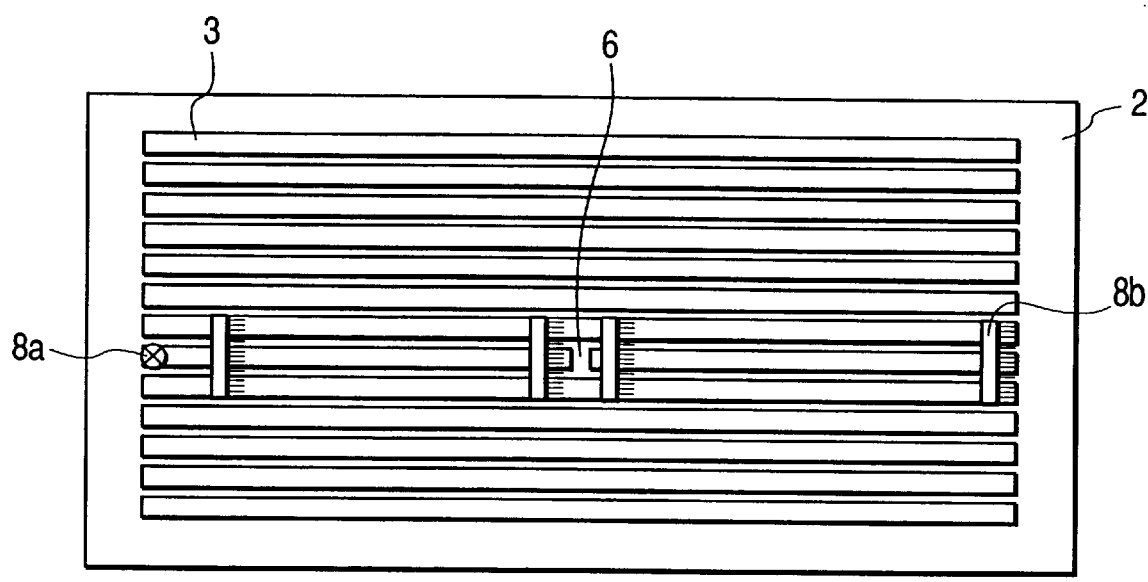
FIG. 6A is a plan view of an inspection device f or inspecting a position of a defect of an electrode.
Figure 6B:
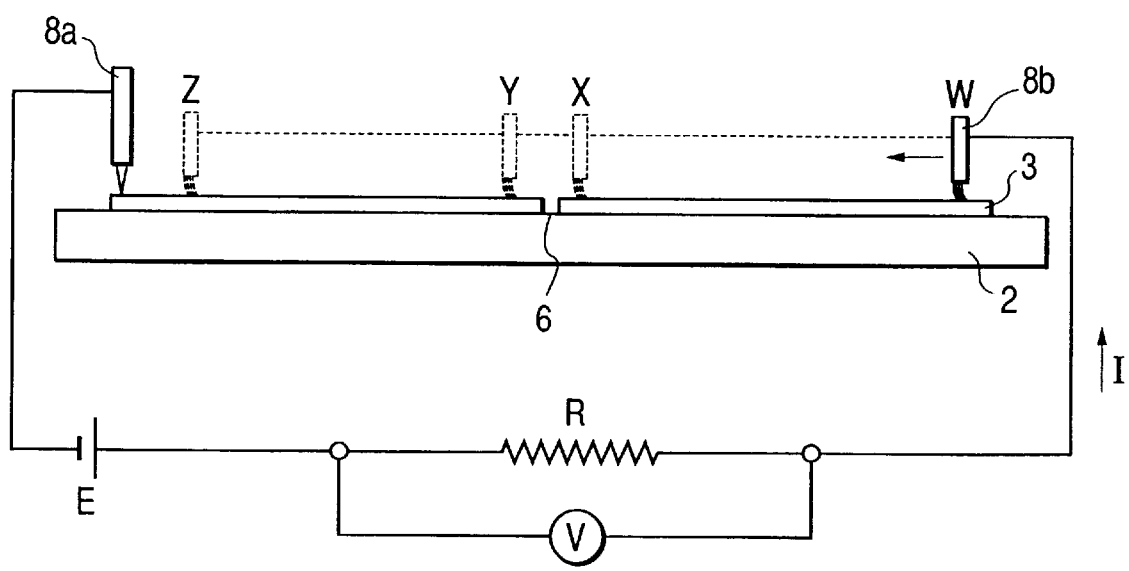
FIG. 6B is a circuit thereof.

FIGS. 6A and 6B are schematic top and side views, respectively, showing inspection unit 8 identifying the position of open defect 6. In this respect, inspection brush 8b has a width such that it covers neighboring electrodes 3 and, hence, even if inspection brush 8b is shifted slightly in the transverse direction, an inspection error is not caused.

In the other inspection process, when glass substrate 2 on which electrodes 3 are formed is placed on the table 12, inspection probe 8a and inspection brush 8b are positioned on both sides of electrode 3 to inspect electrodes 3. As illustrated in FIG. 6B, inspection probe 8a and inspection brush 8b are interconnected to inspection circuit 8c. Inspection unit 8 is constituted by an electric power source E, a resistance R, and a voltmeter for measuring voltage across the resistance R. Each end of inspection unit 8 is connected to inspection probe 8a or the inspection brush 8b, respectively. In inspection unit 8, when electrode 3 is normally formed, electrical continuity exists in electrode 3 and a voltage is produced across the resistance R formed in the inspection circuit 8c. However, when open defect 6 exits in electrode 3, electrical continuity does not exist and hence a voltage is not produced across the resistance R. Therefore, each electrode 3 can be inspected for an open defect by monitoring the voltage (V) across the resistance R.

If electrode 3 is identified as having an open defect, inspection brush 8b is moved toward inspection probe 8a to identify the position of the open defect.

As shown in FIG. 6B, inspection brush 8b is slid from position W toward inspection probe 8a in the direction of position Z. When inspection brush 8b is at a position X, before the broken defective part 6, voltage across the resistance is not produced and when it is at position Y, after the broken wire defect 6, voltage across the resistance is produced, whereby the position of open defect 6 is identified. In this way, it is possible to correctly identify the line and the place where open defect 6 is located.

If open defect 6 is detected, transfer unit 4 is operated. Transfer probe 4a of transfer unit 4 is connected to moving unit 13a and is controlled by control unit 11, such that it can freely move between plate paste 1c and open defect 6.

Paste 1 is transferred to open defect 6 by transfer unit 4 and then is baked by the heating unit comprising semiconductor laser 5a. Semiconductor laser 5a is connected to a moving unit 13b and is controlled by control unit 11, such that it can freely be moved above paste 1 that has been transferred to open defect 6.

As described above, since electrodes 3 on all the lines are inspected and repaired, the substrate can now be used as a good product. Further, the present invention is not limited to the above-mentioned preferred embodiment, it can be applied to, for example, repairing an opaque film formed on a mask that is subsequently used to form an electrode on a glass substrate, or on a mask substrate for forming a semiconductor.

FIG. 7 shows a method for forming an electrode pattern on a substrate by using an opaque film mask. And, FIG. 8 shows a method for repairing a defective part of a metallic pattern in the opaque film mask.

A mask 20 shown in FIG. 7 is formed by providing an opaque film 22 formed by a metallic pattern on one side of a glass substrate 21. Opaque film 22 is preferably formed by depositing the metallic pattern by sputtering chromium (Cr).

When mask 20 is used for a liquid crystal display substrate, an electrode formed of ITO or the like can be formed on glass substrate 2 for a liquid crystal. That is, as shown in FIG. 7, in a substrate in which glass substrate 2, the electrode layer 3 and a resist layer 15 are laminated in sequence, mask 20 is placed on the resist layer 15 and is exposed to light. After exposing resist layer 15 to light, the resist is developed to remove all but the portions of resist layer 15 covered by opaque film 22, whereby a resist pattern is formed. Then, electrodes 3 by etching using the resist pattern as an etching mask. Then, the process is completed by removing the remaining resist layer 15 on opaque film 22.

During the manufacture of mask 20, a metallic pattern is formed on glass substrate 21 to create an opaque film 22. Sometimes during the manufacturing process, a defective 24, shown in FIG. 8, might be accidentally formed on opaque film 22. To repair defect 24, paste 23 is transferred to defect 24 and is baked to repair defect 24. In this case, the same metallic organic compound described above, to be more specific, gold paste of gold-resinate-based MOD (metalloorganic deposition) type can be used as paste 23.

The same semiconductor laser described above can be used for baking paste 23 and the wavelength of the laser ranges within the near-infrared range. In this regard, glass substrate 21 is not damaged because it is baked by the semiconductor laser (near-infrared radiation). That is, since the laser light passes through glass substrate 21 and is absorbed by opaque film 22, there is little difference in temperature between the portion of paste 23 transferred to glass substrate 21 and the portion of paste 23 transferred to the metallic plane of opaque film 22. Hence, both portions are uniformly heated, which prevents problems caused by a difference in the solidification of the parts.

The defective repaired in the manner described above sometimes has a portion protruding from the metallic pattern of opaque film 22 (the diagonally shaded area in FIG. 8) and the portion protruding from the metallic pattern is required to be removed because the quality as of mask 20 is deteriorated in this state (in the case of the electrode, the part sticking out from the metallic pattern is acceptable, if the part is not short-circuited). To remove the protruding portion, a device for applying laser irradiation such as YAG laser is used.

The repairing device according to the present invention is provided with a laser device for applying laser rays such as YAG laser for irradiating mask 20.

According to the present invention, even if an open defective is detected in an electrode, the defective can be repaired by a metallic thin film of high quality that has good electric characteristics that avoids the need to heat the substrate, which can damage a substrate.

Further, according to the present invention, only the paste placed in the defective is heated and other portions of the substrate are not heated by the semiconductor laser used to bake the paste, and hence the substrate does not suffer damage. Furthermore, the metal in the defective is treated by a baking process comprising provisional baking and main baking process and a cooling process, and hence a dense metallic thin film with no cracks can be produced.

Still further, since both of the transfer unit and the heating unit according to the present invention can be made very compact and can be attached to a conventional device, they have good general versatility. Since a semiconductor laser is used as a heating unit, it can eliminate the drawbacks of a conventional laser unit, such as short life and difficult handling.

In addition, the present invention can be used to repair an opaque film of a mask.

Many widely different embodiments of the invention may be constructed without departing from the spirit and the scope of the present invention. It should be understood that the present invention is not limited to the specific embodiments described in the specification, except as defined in the appended claims.

What is claimed is:

1. A substrate comprising a metallic pattern containing a repaired defect, wherein the repaired defect includes a metal thin-film deposited from a metallic organic compound, and wherein the metallic organic compound comprises a material that selectively absorbs laser radiation energy.

2. A substrate having a metallic pattern containing a repaired defect according to claim 1, wherein said metallic pattern is an electrode.

3. A substrate having a metallic pattern containing a repaired defect according to claim 1, wherein said metallic pattern is an opaque film.

4. A substrate having a metallic pattern containing a repaired defect according to claim 1, wherein said metallic organic compound is gold-resinate-base paste for low temperature baking.

5. A substrate having a metallic pattern containing a repaired defect according to claim 2, wherein said metallic organic compound is gold-resinate-base paste for low temperature baking.

6. A substrate having a metallic pattern containing a repaired defect according to claim 3, wherein said metallic organic compound is gold-resinate-base paste for low temperature baking.

7. A substrate having a metallic pattern thereon containing a repaired portion, the repaired portion comprising a metal thin film deposited from a laser light-sensitive black paste.

8. The substrate of claim 7, wherein the laser light-sensitive black paste comprises a material that selectively absorbs laser radiation in the near-infrared range.

9. The substrate of claim 7, wherein the laser light-sensitive black paste comprises a metallic organic compound.

10. The substrate of claim 9, wherein the metallic organic compound comprises a gold-resinate-based paste.

11. A glass substrate in a liquid crystal display device having a metallic pattern thereon containing a repaired portion, the repaired portion comprising a metal thin film deposited from a laser light-sensitive metallic organic compound.

12. The glass substrate of claim 11, wherein the laser light-sensitive metallic organic compound comprises a black paste.

13. The glass substrate of claim 11, wherein the laser light-sensitive metallic organic compound comprises a gold-resinate-based paste.

* * * * *